United States Patent [19]

Mizuta

[11] Patent Number: 5,058,075

[45] Date of Patent: Oct. 15, 1991

[54] BATTERY CIRCUIT FOR AN INTEGRATED CIRCUIT (IC) MEMORY CARD

[75] Inventor: Masaharu Mizuta, Itami, Japan

[73] Assignee: Mitsubishi Denki Kabushiki Kaisha, Japan

[21] Appl. No.: 280,423

[22] Filed: Dec. 6, 1988

[30] Foreign Application Priority Data

Aug. 12, 1988 [JP] Japan .................. 63-199995

[51] Int. Cl.⁵ .............................. G11C 5/14
[52] U.S. Cl. ................. 365/229; 365/226; 307/64; 307/66
[58] Field of Search ............ 365/52, 226, 228, 229, 365/189.09; 307/64, 66; 235/380, 492

[56] References Cited

U.S. PATENT DOCUMENTS

| | | | |
|---|---|---|---|
| 4,223,395 | 9/1980 | Sakaguchi et al. | 365/229 |
| 4,395,639 | 7/1983 | Bring | 307/66 |
| 4,611,302 | 9/1986 | Bockett-Pugh | 365/228 |
| 4,857,756 | 8/1989 | Haneda | 365/228 |
| 4,908,790 | 3/1990 | Little et al. | 365/229 |

FOREIGN PATENT DOCUMENTS

| | | | |
|---|---|---|---|
| 0186361 | 10/1984 | Japan | 365/226 |
| 61-150088 | 7/1986 | Japan | |
| 0269292 | 11/1986 | Japan | 365/226 |

OTHER PUBLICATIONS

Bhuta et al., "Extending Available Logic Power After a Primary Power Loss", IBM TDB, vol. 23, No. 7B, Dec. 1980, pp. 3165–3166.

"IC Memory Card Guideline" pp. 1–33, Sep. 1986, edited by personal computer affairs committee of Nippon Denshi Kogyo Shinko Kyokai.

Primary Examiner—Glenn Gossage
Attorney, Agent, or Firm—Leydig, Voit & Mayer

[57] ABSTRACT

A battery circuit incorporated in an integrated circuit (IC) memory card includes a power control circuit having a power output for connection to a power input of a memory chip of the IC memory card, a data backup battery and an active switching device. The active switching device prevents a current from flowing into the data backup battery when the voltage applied to an external power supply line is higher than the voltage of the battery. The active switching device electrically connects the battery for supplying the battery voltage to the power output in response to a voltage greater than the battery voltage applied to the power output through the external power supply line and electrically connects the battery to the power output when the battery is connected for supplying the battery voltage to the power output and the voltage of the battery is higher than that of the external power supply line. The switching device also disconnects the battery from the power output in response to a control signal supplied from outside of the card via the external power supply line.

4 Claims, 4 Drawing Sheets

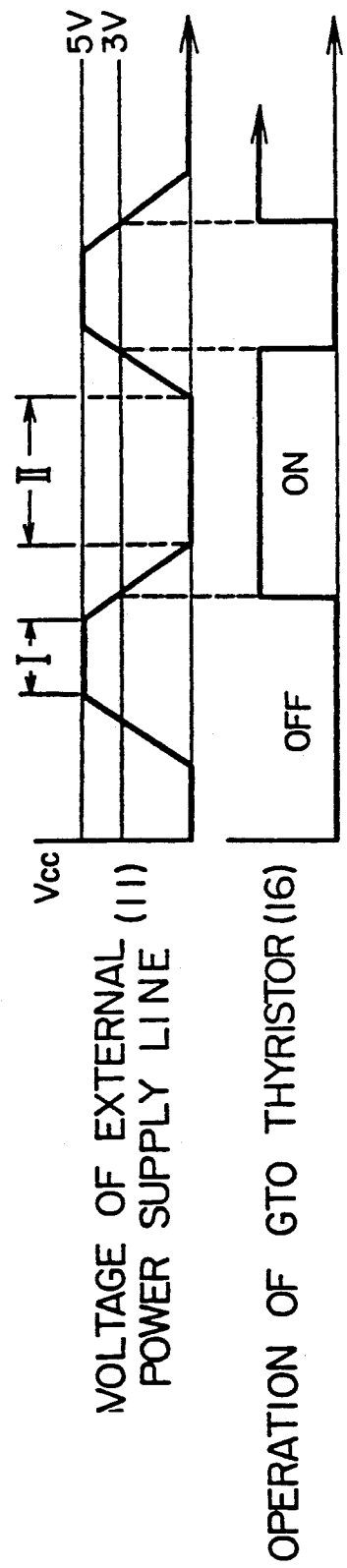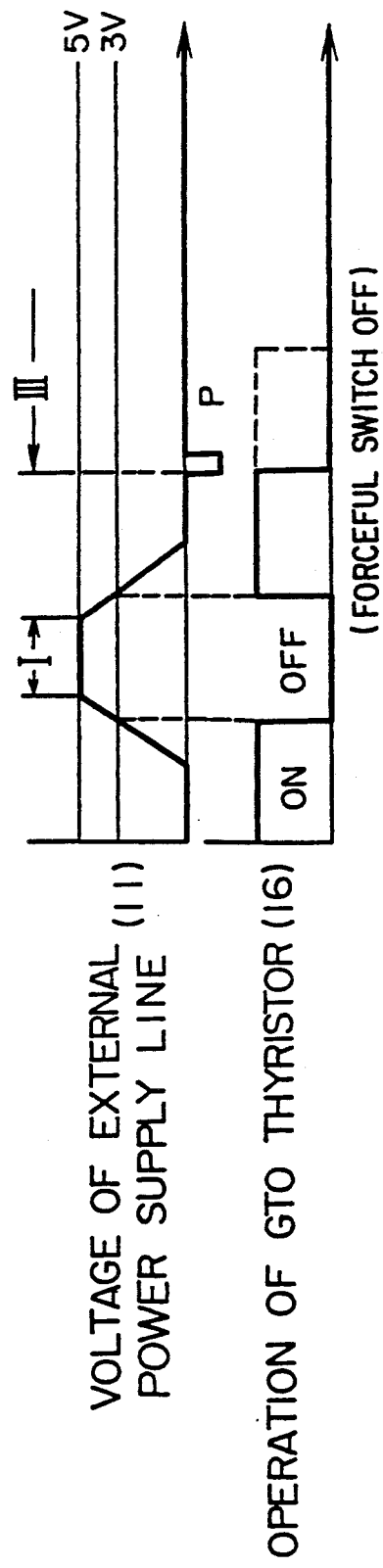

BATTERY CIRCUIT FOR AN INTEGRATED CIRCUIT (IC) MEMORY CARD

BACKGROUND OF THE INVENTION

This invention relates to a battery circuit adapted to control connection between a main circuit of an integrated circuit (IC) memory card or, more specifically, a random access memory card and a battery incorporated in the card.

FIG. 1 shows a block diagram of the construction of a conventional random access memory card (hereinafter referred to as "RAM card") which is described in "IC Memory Card Guideline" (published in September 1986) edited by a personal computer affairs committee of Nippon Denshi Kogyo Shinko Kyokai, a corporation. Referring to FIG. 1, a RAM chip section 2 is normally constituted by a plurality of static RAMs. An interface connector 1 is provided for connection to an IC card terminal (not shown). A control line 4 and an address line 5 connect the interface connector 1 to the RAM chip section 2 through a chip selection control circuit 3 adapted to select a designated one of the static RAMs of the RAM chip section 2. A data line 6 is directly connected between the interface connector 1 and the RAM chip section 2. An external power supply line 1 and a ground line for connection to a power source provided outside the RAM card via the interface connector 1 are connected to a power supply control circuit 10 to which is also connected a power supply line 9a extending from a data backup battery 9 (hereinafter referred to simply as "battery") to keep data stored in the RAM chip section 2 during the time when the RAM card is detached from the IC card terminal and when it cannot be supplied with power from the outside. The power supply control circuit 10 operates to supply power from the external power supply line 11 or the battery 9 to the RAM chip section 2 and to the chip selection control circuit 3 via a power supply line 13. Ordinarily, the voltage Vbb of the battery 9 is about 3V while the voltage Vcc at the external power supply line 11 is about 5V when the RAM card is supplied with power from external power source. There are two types of RAM cards depending upon the period of time in which the battery 9 is available: one in which the battery 9 is completely embedded and cannot be replaced, that is, a throwaway type card; and one in which the used battery can be easily replaced with a new one. Generally, RAM cards of a small capacity are of the embedding type while RAM cards of a large capacity are of the battery-replaceable type.

FIG. 2 shows one of simplest examples of the battery circuit of the RAM card shown in FIG. 1 in order to explain fundamental functions thereof. In FIG. 2, components identical to those shown in FIG. 1 are indicated by the same reference characters. A battery circuit 20 has a diode 14 for preventing a battery current leak from the battery 9 to the outside of the RAM card, and a diode 15 for preventing the battery from being charged via the outside power supply line 11. By the function of these two diodes, one of the voltage Vcc of the external power supply line 11 and the voltage Vbb of the battery 9 is selected as an internal voltage Vdd. Thus, this circuit constitutes the simplest example of the control circuit 10. As mentioned above, in a large-capacity RAM card, the RAM chip section 2 includes a multiplicity of static RAMs, and the backup current flowing out of the battery 9 is large. In this case, therefore, the life of battery 9 is short. For this reason, such RAMs are ordinarily of the battery-replaceable type.

FIG. 3 is a circuit diagram for illustration of a state in which the battery 9 is packaged separately from the RAM card body 21 (represented by the battery circuit when shipped (forwarded) from the manufacturer; and FIG. 4 is also a circuit diagram for illustration of a state in which the battery 9 is attached to the RAM card body 21 when the RAM card body 21 and the battery 9 are taken out of the packagings so that they can be used. In the case where the RAM card will not be used for a long period of time and there is no need to maintain the data stored in the RAM card, the battery 9 is detached from the RAM card body 21 in order to avoid reduction in the life of the battery 9.

In the case of a RAM card having the thus-constructed conventional battery circuit, it is undesirable in terms of battery life to previously attach the battery to the RAM card body at the time of forwarding, and it is therefore necessary to pack up the battery and the RAM card body separately from each other. In addition, in the case where the RAM card will not be used for a long period of time and where there is no need to maintain data stored in the RAM card, the battery must be detached from the RAM card, thus necessitating troublesome operations.

SUMMARY OF THE INVENTION

In view of these problems, it is an object of the present invention to provide a battery circuit for an IC memory card which eliminates the need for detaching the battery from the RAM card body and packing them separately from each other at the time of forwarding, which enables the RAM card to be forwarded with the battery previously connected to the RAM card body while preventing any substantial consumption of the battery energy, and which is capable of readily disconnecting itself from the battery electrically by a predetermined electrical signal supplied from the outside of the RAM card via the external power supply line without detaching the battery from the card if the card will not be used for along period of time.

To this end, the present invention provides a battery circuit incorporated in an IC memory card having:

a power control circuit having a ground input, first and second power inputs, and a power output for connection to a power input of a memory chip;

an external power supply line and a ground line connected to the first power input and the ground input of said power control circuit, respectively, for supplying power from outside of the card to the power control circuit;

a data backup battery having negative and positive terminals connected to the ground input and the second power input of said power control circuit, respectively, said battery producing a voltage at the positive terminal, said power control circuit including an active switching device connected between the second power input and the power output and coupled to the first power input, the active switching device preventing a current flowing into the first power input from flowing out of the second power input into the data backup battery when the voltage applied to the external power supply line is higher than the voltage of the battery, electrically connecting the battery for supplying the battery voltage to the power output in response to a voltage greater than the voltage of said battery applied to the power output via the external power supply line and electrically connecting the battery to the power output when the battery is connected for supplying the battery voltage to the power output and the voltage of the battery is higher than the voltage of the external power supply line and electrically disconnecting the battery from the power output in response to a control signal supplied from outside of the card via the external power supply line.

Preferably, a gate turn off type of thyristor (hereinafter referred to as GTO thyristor) capable of being readily controlled in a switching-on/off manner is used as the active switching device in the above IC memory card battery circuit of the present invention. If the GTO thyristor is supplied with a current through its gate terminal when the potential of the anode is higher than that of the cathode, it is switched on. If a negative voltage is applied to the gate terminal to supply a negative current through the gate terminal, the thyristor is switched off. The circuit is designed to apply the desired electrical signal from the outside of the card to the gate terminal of the GTO thyristor via the external power supply line, thereby enabling the battery backup function to be controlled from the outside.

BRIEF DESCRIPTION OF THE DRAWINGS

FIG. 6 is a diagram relating to a circuit operation performed when power is supplied from an external power source for the first time to activate the battery backup function; and FIG. 7 is a diagram relating to a circuit operation performed when the battery backup function is canceled in the case where there is no need for battery backup.

DESCRIPTION OF THE PREFERRED EMBODIMENT

Figure 1:
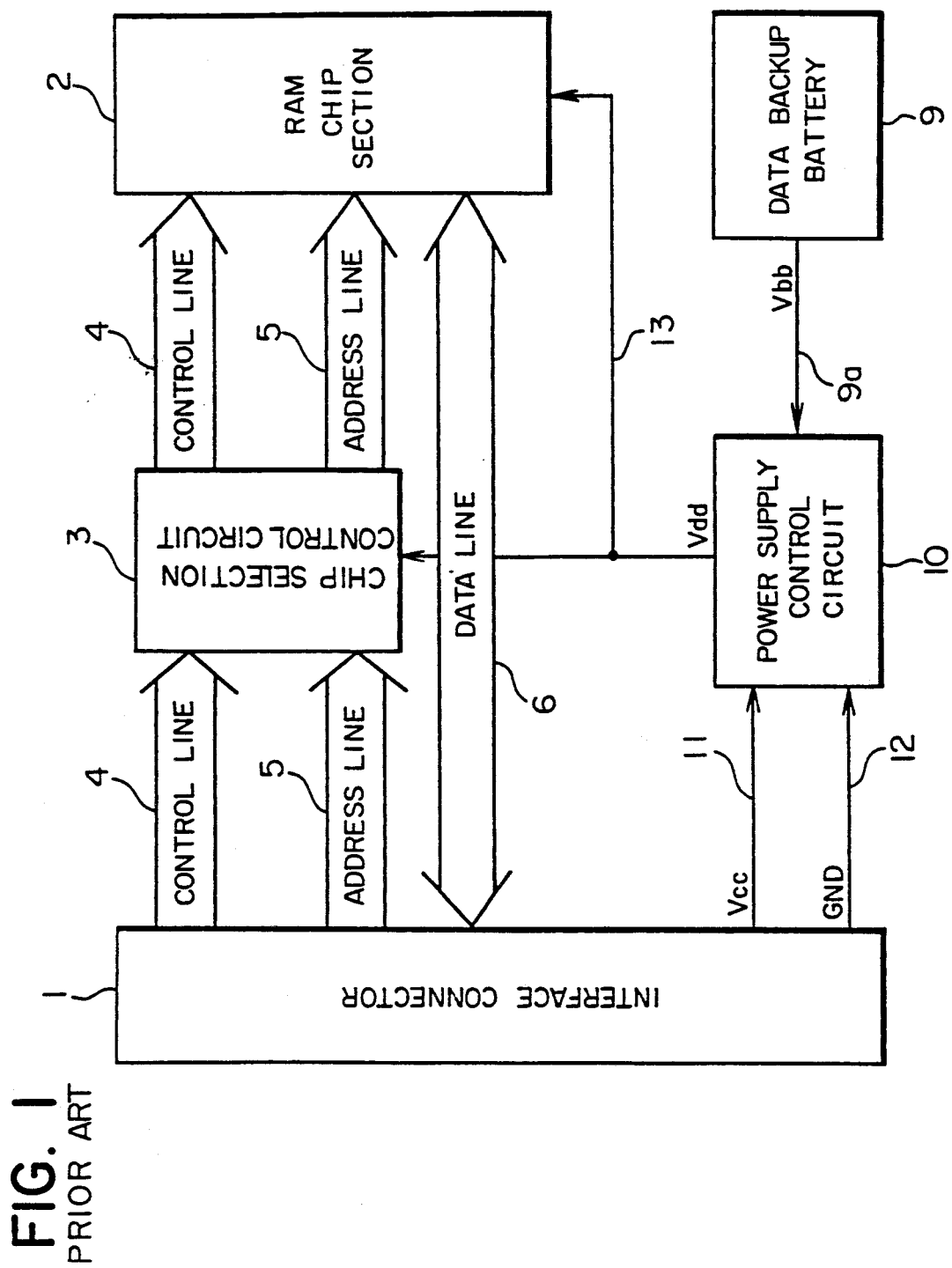
FIG. 1 is a block diagram of the internal construction of a conventional RAM card.
Figure 2:
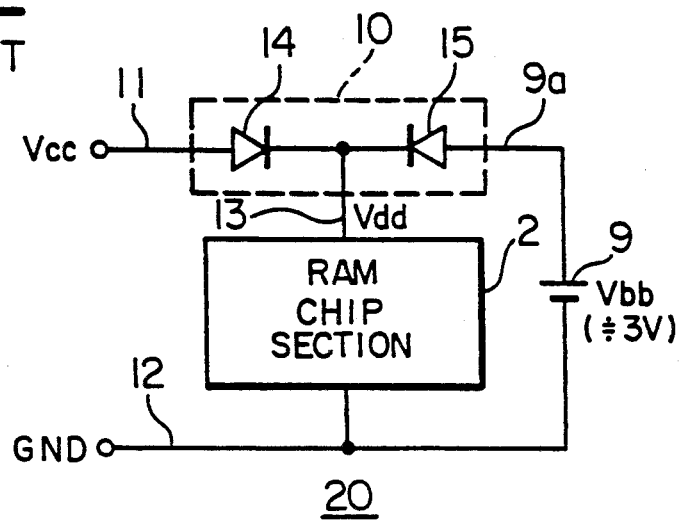
FIG. 2 is a circuit diagram of a portion of the battery circuit shown in FIG. 1.
Figure 3:
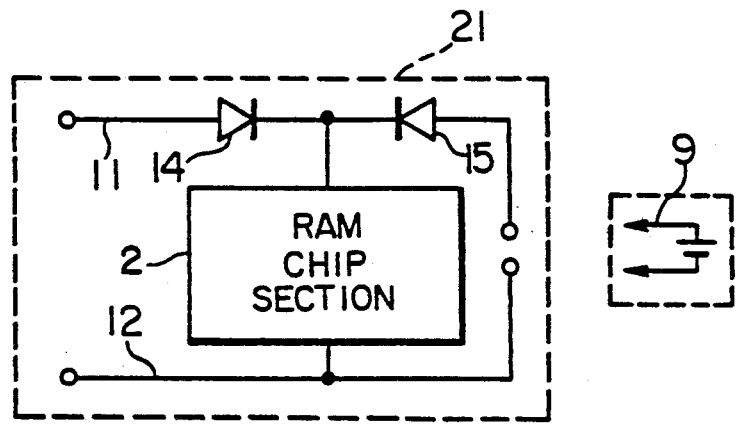
FIG. 3 is a circuit diagram illustrating a state of forwarding of the RAM card and the battery shown in FIG. 1.
Figure 4:
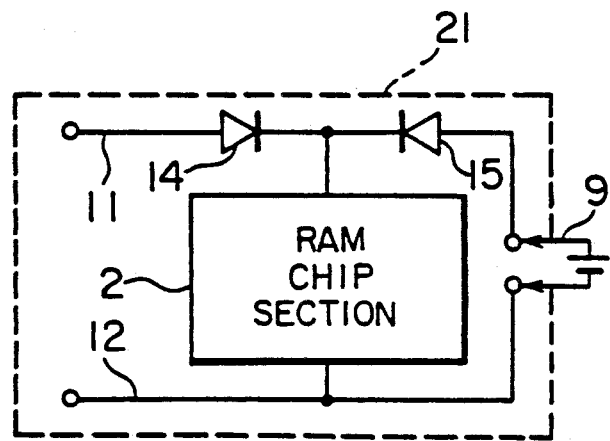
FIG. 4 is a circuit diagram illustrating a state in which the battery is connected to the RAM card shown in FIG. 1.
Figure 5:
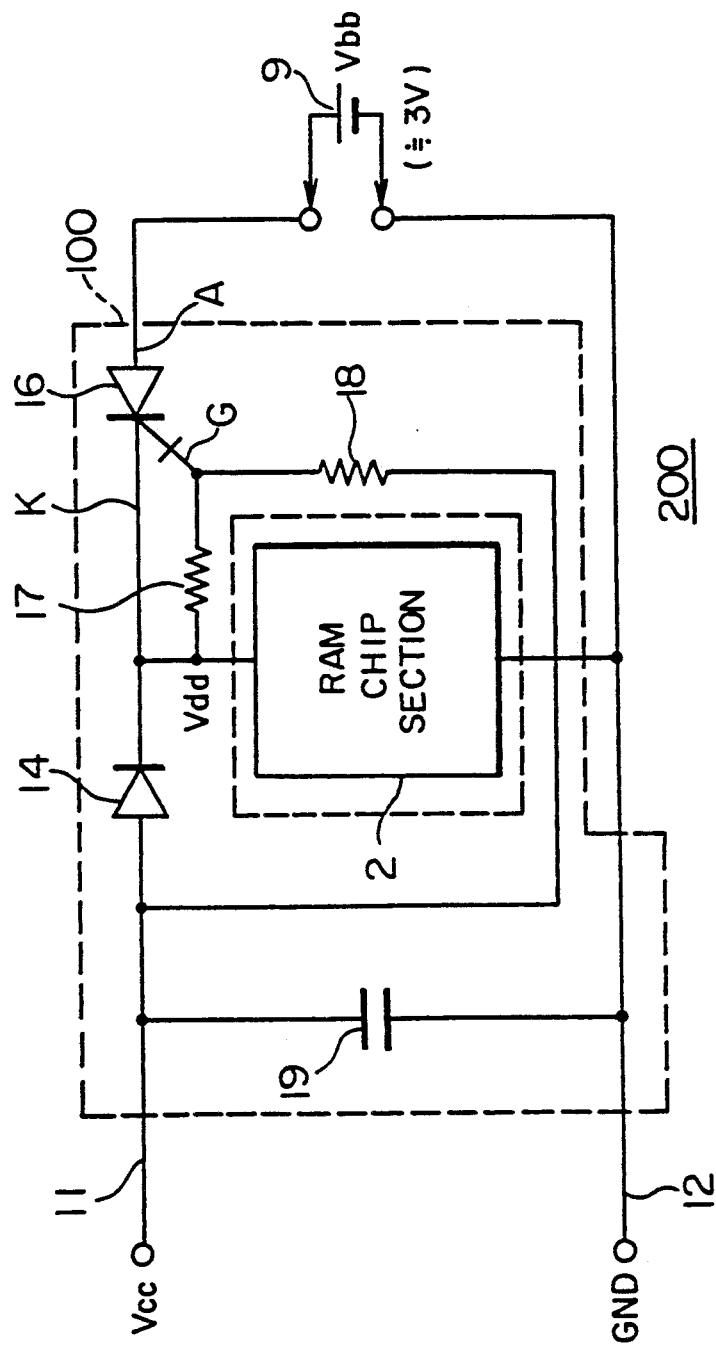
FIG. 5 is a circuit diagram of an IC memory card battery card in accordance with the present invention.

An embodiment of the present invention will be described below with reference to the accompanying drawing. FIG. 5 shows a circuit diagram of an IC memory card battery circuit. In FIG. 5, components identical to those shown in FIG. 2 are indicated by the same reference characters. A power control circuit 100 which is provided in a battery circuit 200 includes: a diode 14 for preventing a battery current leak to the outside of the RAM card; a GTO thyristor 16 which is an active switching device for preventing a battery 9 from being charged by a current from an external power source as well as controlling the battery current; a gate resistor 17 for preventing occurrence of a phenomenon in which the GTO thyristor is switched on by an internal cause such as a leak current without being supplied with a current from the outside through a gate terminal G, that is, a malfunction due to self-switching; a dividing resistor 18 for adjusting the level of a negative voltage for forcibly switching off the GRTO thyristor 16 by applying a negative voltage pulse from an external unit for the RAM card, e.g., an IC card terminal to an external power supply line 11; and a capacitor 19 for preventing the voltage Vcc of the external power supply line 11 from abruptly changing when the RAM card is connected or disconnected from the RAM card. As is well-known, the GTO thyristor 16 has characteristics such that:

(1) when no current flows through the gate terminal G, it is maintained in a off state against a voltage of either polarity, (2l) if it is supplied with a current through the gate terminal G when the potential of the anode terminal A is higher than that of the cathode terminal K, it is switched on, and (3) if it is supplied with a negative gate current by the application of a magnetic voltage (pulse) higher than a certain level to the gate terminal G, it is switched off.

FIGS. 6 and 7 show the voltage Vcc of the external power supply line 11 and the state of operation of the thyristor 16 with time. FIG. 6 shows a state in which the RAM card is connected for the first time to, for example, the IC card terminal and a voltage is applied to the external power supply line 11 to activate the battery backup function, and FIG. 7 shows a state in which the battery backup function is canceled when there is no need for battery backup.

The operation of this embodiment will now be described with reference to FIGS. 5 to 7. Referring first to FIG. 6, the RAM card is inserted into and connected to the IC card terminal, and a voltage is thereafter applied to the external power supply line 11 for the first time after forwarding by, for example, an operation of a keyboard of the IC card terminal (both not shown) so that the voltage Vcc is increased from 0V to 5V at which the RAM card can be operated for read/write. Processing in the RAM card, e.g., writing is thereafter performed. A period of time when the processing in the RAM card is performed is represented by a period [I]. The GTO thyristor 16 is in an off state before and during this processing, and the battery backup function is not actuated. In fact, the GTO thyristor 16 is switched on for a very short time immediately before the voltage Vcc reaches 3V but the battery backup function is not substantially activated. So long as the GTO thyristor 16 is not switched on, the potential of the internal voltage Vdd increases at substantially the same rate as the voltage Vcc. The resistance value of the dividing resistor 18 is set in such a manner that the GTO thyristor 16 is not switched on until the voltage Vcc increases to a level of about 3V. Therefore, even if the GTO thyristor 16 is switched on during the period [I], the time for this on state is very short.

When the supply of power from the external power supply line 11 is cut after processing of writing data into or reading data from the RAM card has been completed, the voltage Vcc decreases from 5V toward 0V. When, during this state, the voltage Vcc becomes lower than the battery voltage Vbb (about 3V), the GTO thyristor 16 is switched on so as to activate the battery backup function. This is because, at this point, the battery voltage Vbb at the anode terminal A of the GTO thyristor 16 becomes higher than the external power supply voltage Vcc at the cathode terminal K and, at the same time, and a gate current flows from the external power supply line 11 into the gate terminal G of the GTO thyristor 16, thereby satisfying the conditions for switching-on of the GTO thyristor 16. A period of time [II] when the voltage Vcc of the external power supply line 11 is 0V corresponds to the time when the RAM card is carried while being separated from the IC card terminal. During this time, the on state of the GTO thyristor 16 is continued. The battery backup function is therefore activated. When the RAM card is connected to the IC card terminal and when the desired voltage is applied to the external power supply line 11 so that it becomes higher than the battery voltage Vbb of about 3V, the GTO thyristor 16 is switched off. The above-described operations are thereafter repeated. During the very short period of time when the power supply change-over is effected by the diode 14 and the GTO thyristor 16, the voltage across the RAM chip 2 is maintained by the capacitor 19 which is inserted between the external power supply line 11 and the ground line 12, thereby preventing any problem of data stored in the RAM chip 2 disappearing of being not maintained.

Referring then to FIG. 7, processing in the RAM card is completed and the supply of power from the external power source to the external power supply line 11 is stopped (at this time, the RAM card is still connected to the IC card terminal), the voltage Vcc begins to decrease from 5. When the voltage Vcc thereafter becomes lower than the battery voltage Vbb of 3V, the GTO thyristor 16 is switched on, and the voltage Vcc further decreases to 0V. If a negative voltage pulse P is thereafter applied to the external power supply line 11 by the operation of the keyboard of the IC card terminal so as to be supplied to the gate terminal G of the GTO thyristor 16 via the dividing resistor 18 while backup function in the RAM card is activated, a negative gate current flows through the gate so that the GTO thyristor 16 is forcibly switched off, thereby interrupting the battery backup function. A period of time after this point is indicated as a period of time [III]. This operation is performed for the purpose of preventing any wasteful consumption of the battery energy, immediately before the manufacturer forwards the RAM card after the final checking of the functions of the card or in the case where there is no need to maintain data stored in the RAM card and where the RAM card will not be used for a long period of time.

As described above, the present invention provides the battery circuit in the IC memory card with an active switching device and a section for controlling this device, and which is capable of preventing any current from flowing into the battery as well as controlling connection and disconnection between the battery and the battery circuit in response to a control signal supplied from the outside of the card. The present invention thus constitutes a battery circuit for an IC memory card which is capable of preventing any substantial consumption of the battery energy when the battery is incorporated in the IC card at the time of forwarding while being connected to the battery circuit, and which is also capable of readily disconnecting itself from the battery electrically without detaching the battery from the card if the card will not be used for a long period of time. Further the present invention is applicable to not only the RAM card but also any cards which incorporate a battery.

What is claimed is:

1. A battery circuit incorporated in an integrated circuit (IC) memory card comprising:
   a power control circuit having a ground input, first and second power inputs, and a power output for connection to a power input of a memory chip;
   an external power supply line and a ground line connected to the first power input and the ground input of said power control circuit, respectively, for supplying power from outside of said card to said power control circuit; and
   a data backup battery having negative and positive terminals connected to the ground input and the second power input of said power control circuit, respectively, said battery producing a voltage at the positive terminal,
   said power control circuit including an active switching device connected between the second power input and the power output
   and coupled to the first power input, said active switching device preventing a current flowing into the first power input from flowing out of the second power input into said data backup battery when the voltage applied to said external power supply line is higher than the voltage of said battery,
   electrically connecting said battery for supplying the voltage of said battery to said power output in response to a voltage greater than the voltage of said battery applied to said power output via said external power supply line and electrically connecting said battery to said power output when the battery is connected for supplying the voltage of said battery to said power output and the voltage of said battery is higher than the voltage of said external power supply line, and
   electrically disconnecting said battery from said power output in response to a control signal supplied from outside of said card via said external power supply line.

2. A battery circuit according to claim 1 wherein said power control circuit includes:
   means for preventing a battery current supplied from said data backup battery to the memory chip through said power output from flowing out of said card, said means for preventing being connected between the first power input and the power output; and
   means for preventing an abrupt change in the voltage applied to said external power supply line connected between the first power input and the ground input.

3. A battery circuit according to claim 2 wherein said means for preventing a battery current from flowing out of said card includes a diode having an anode connected to the first power input and a cathode connected to said power output;
   said means for preventing any abrupt change in the voltage of said external power supply line comprises a capacitor connected between the first power input and the ground input; and
   said active switching device is a gate turn off (GTO) thyristor having a gate, an anode connected to said second power input, and a cathode connected to said power output; and
   a first resistor connected between the power output and the gate of said GTO thyristor to apply a positive signal from said external power supply line to the gate of said GTO thyristor and a second resistor connected between the first power input and the gate of said GTO thyristor to apply a negative pulse provided as said control signal from outside of said card to the gate of said GTO thyristor.

4. A battery circuit according to claim 3 wherein said IC memory card is a random access memory card.

* * * * *